(12) United States Patent
Kuppambatti et al.

(10) Patent No.: US 9,143,144 B2
(45) Date of Patent: Sep. 22, 2015

(54) SYSTEMS AND METHODS FOR PROVIDING A PIPELINED ANALOG-TO-DIGITAL CONVERTER

(75) Inventors: Jayanth Kuppambatti, New York, NY (US); Junhua Shen, Cambridge, MA (US); Peter Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 14/005,887

(22) PCT Filed: Mar. 19, 2012

(86) PCT No.: PCT/US2012/029654
§ 371 (c)(1),
(2), (4) Date: Feb. 27, 2014

(87) PCT Pub. No.: WO2012/129163
PCT Pub. Date: Sep. 27, 2012

(65) Prior Publication Data
US 2014/0197971 A1      Jul. 17, 2014

Related U.S. Application Data

(60) Provisional application No. 61/454,217, filed on Mar. 18, 2011.

(51) Int. Cl.
*H03M 1/12* (2006.01)
*H03M 1/00* (2006.01)
(Continued)

(52) U.S. Cl.
CPC ............... *H03M 1/002* (2013.01); *G06F 1/08* (2013.01); *H03M 1/1245* (2013.01); *H03M 1/442* (2013.01)

(58) Field of Classification Search
CPC ..... H03M 1/1245; H03M 1/44; H03M 1/442; G06F 1/08
USPC .......................................... 341/161–162, 172
See application file for complete search history.

(56) References Cited

U.S. PATENT DOCUMENTS 5,574,457 A * 11/1996 Garrity et al. ................. 341/172
6,169,502 B1  1/2001 Johnson et al.
6,469,652 B1  10/2002 Arlo
(Continued)

OTHER PUBLICATIONS

Abo et al., "A 1.5-V, 10-bit, 14.3-MS/s CMOS Pipeline Analog-to-Digital Converter," in IEEE J. Solid-State Circuits, vol. 34, No. 5, May 1999, pp. 599-606.
(Continued)

*Primary Examiner* — Khai M Nguyen
(74) *Attorney, Agent, or Firm* — Byrne Poh LLP

(57) ABSTRACT

Systems comprising: a first MDAC stage comprising: a sub-ADC that outputs a value based on an input signal; at least two reference capacitors that are charged to a Vref; at least two sampling capacitors that are charged to a Vin; and a plurality of switches that couple the at least two reference capacitors so that they are charged during a sampling phase, that couple the at least two sampling capacitors so that they are charged during the sampling phase, that couple at least one of the reference capacitors so that it is parallel to one of the at least two sampling capacitors during a hold phase, and that couple the other of the at least two sampling capacitors so that it couples the at least one of the reference capacitors and the one of the at least two sampling capacitors to a reference capacitor of a second MDAC stage.

20 Claims, 16 Drawing Sheets

(51) Int. Cl.
    *G06F 1/08* (2006.01)
    *H03M 1/44* (2006.01)

(56) References Cited

U.S. PATENT DOCUMENTS

| | | | |
|---|---|---|---|
| 6,967,611 B2 * | 11/2005 | Atriss et al. | 341/172 |
| 7,268,720 B1 | 9/2007 | Murden et al. | |
| 7,683,819 B2 * | 3/2010 | Kurauchi | 341/172 |
| 8,487,803 B1 * | 7/2013 | Garrity | 341/161 |
| 2005/0219870 A1 | 10/2005 | Yang et al. | |
| 2007/0164889 A1 | 7/2007 | Lee | |
| 2008/0024351 A1 | 1/2008 | Gupta et al. | |
| 2010/0182179 A1 | 7/2010 | Chou | |
| 2010/0182183 A1 | 7/2010 | Thet zin Oo | |

OTHER PUBLICATIONS

Banba et al., "A CMOS Bandgap Reference Circuit with Sub-1-V Operation," in IEEE J. Solid-State Circuits, vol. 34, No. 5, May 2004, pp. 670-674.
Blair, J., "Histogram Measurement of Adc Nonlinearities Using Sine Waves," in IEEE Tran. Instrum. Meas., vol. 43, No. 3, Jun. 1994, pp. 373-383.
Brooks et al., "A 12b, 50 MS/s, Fully Differential Zero-Crossing Based Piplined ADS," In IEEE Journal of Solid-State Circuits, vol. 44, Dec. 2009, pp. 3329-3343.
Brooks, et al. "A Zero-Crossing Based 8-bit 200 MS/s Pipelined ADC," in IEEE Journal of Solid-State Circuits, vol. 42, No. 12, pp. 2677-2678, Dec. 2007.
Cao et al., "A 14mW 2.5 MS/s 14bit Sigma-Delta Modulator Using Pseudo-Differential Split-Path Cascode Amplifiers," in IEEE Custom Integrated Circuits Conference, Sep. 2006, pp. 49-52.
Cao et al., "A 32mW 1.25 GS/s 6b 2b/step SAR ADC in 0.13 pm CMOS," in IEEE Intern. Solid-State Circuits Conference, Feb. 2008, pp. 542-634.
Chang et al., "Radix-Based Digital Calibration Techniques for Multi-Stage Recycling Pipelined ADSc, " In IEEE Transactions on Circuits and Systems, vol. 51, Nov. 2004, pp. 2133-2140.
Chu, et al., "A Zero-Crossing Based 12b 100MS/s Pipelined ADC with Decision Boundary Gap Estimation Calibration," in Symp. on VLSI circuits, Jun. 2010, pp. 237-238.
Craninckx et al., "A 65fJ/conversion-step 0-to-50MS/s 0-to-0.7 mW 9b Charge-Sharing SAR ADC in 90nm Digital CMOS," in IEEE Intern. Solid-State Circuits Conference, Feb. 2007, pp. 246-600.
Fiorenza et al., "Comparator-Based Switched-Capacitor Circuits for Scaled CMOS Technologies", In IEEE Journal of Solid-State Circuits, vol. 41, Dec. 2006, pp. 2658-2668.
Furuta et al., "A 0.06 mm2 8.9 b ENOB 40MS/s Pipelined SAR ADC in 65nm CMOS," in IEEE Intern. Solid-State Circuits Conference, Feb. 2010, pp. 382-383.
Gubbins et al., "Continuous-Time Input Pipeline ADCs," in IEEE Journal of Solid-State Circuits, vol. 45, No. 8, Aug. 2010, pp. 1456-1468.

Hu et al., "A 9.4-bit, 50-MS/s, 1.44-mW Pipelined ADC Using Dynamic Source Follower Residue Amplification," IEEE Journal of Solid-State Circuits, vol. 44, No. 4., Apr. 2009, pp. 1057-1066.
International Preliminary Report on Patentability dated Mar. 18, 2014 in International Patent Application No. PCT/US2012/029654.
Kapusta et al., "A 14b 80MS/s SAR ADC with 73.6 dB SNDR in 65nm CMOS," in IEEE Intern. Solid-State Circuits Conference, Feb. 2013, pp. 472-473.
Karanicolas et al., "A 15-b 1-Msample/s Digitally Self-Calibrated Pipeline ADC," in IEEE J. Solid-State Circuits, vol. 28, No. 12, Dec. 1993, pp. 1207-1215.
Lee et al., "A 12 b 5-to-50 MS/s 0.5-to-1 V Voltage Scalable Zero-Crossing Based Pipelined ADC," in IEEE J. Solid-State Circuits, vol. 47, No. 7, Jul. 2012, pp. 1603-1614.
Lee et al., "A SAR-Assisted Two-Stage Pipeline ADC," in IEEE J. Solid-State Circuits, vol. 46, No. 4, Apr. 2011, pp. 859-869.
Liu et al., "A 10b 100MS/s 1.13mW SAR ADC with Binary-Scaled Error Compensation," in IEEE Intern. Solid-State Circuits Conference. IEEE, Feb. 2010, pp. 386-387.
Liu et al., "A 12-bit, 45-MS/s, 3-mW Redundant Successive-Approximation-Register Analog-to-Digital Converter with Digital Calibration," IEEE J. Solid-State Circuits, vol. 46, No. 11, Nov. 2011, pp. 2661-2672.
Moon et al., "Background Digital Calibration Techniques for Pipelined ADCs," in IEEE Trans. Circuits Syst. II, vol. 44, No. 2, Feb. 1997, pp. 102-109.
Nezuka et al., "A 10-bit 200MS/s Pipeline A/D Converter for High-Speed Video Signal Digitizer," in Asian Solid-State Circuits Conference, Nov. 2006, pp. 31-34.
Reeder et al., "Analog-to-digital Converter Clock Optimization: A Test Engineering Perspective," in Analog Dialogue, vol. 42, No. 1, Feb. 2008, pp. 1-12.
Sepke et al., "Noise Analysis for Comparator-Based Circuits," in IEEE Trans. Circuits Syst. I, vol. 56, No. 3, Mar. 2009, pp. 541-553.
Shettigar et al., "Design Techniques for Wideband Single-Bit SD Continuous-Time Modulators With FIR Feedback DACs," in IEEE J. Solid-State Circuits, vol. 47, No. 12, Dec. 2012, pp. 2865-2879.
Shin et al., "A 12b 200MS/s Frequency Scalable Zero-Crossing Based Pipelined ADC in 55nm CMOS," in IEEE Custom Integrated Circuits Conference, Sep. 2012, pp. 1-4.
Siragusa et al., "A Digitally Enhanced 1.8-V 15-bit 40-MSample/s CMOS Pipelined ADC," in IEEE J. Solid-State Circuits, vol. 39, No. 12, Dec. 2004, pp. 2126-2138.
Walden et al., "Analog-to-Digital Converter Survey and Analysis," IEEE J. Selected Areas Comm., vol. 17, No. 4, Apr. 1999, pp. 539-550.
Written Opinion and International Search Report dated Jun. 8, 2012 in PCT/US2012/029654.
Yang et al., "A 3-V 340-mW 14-b 75-Msample/s CMOS ADC with 85-dB SFDR at Nyquist input," IEEE J. Solid-State Circuits, vol. 36, No. 12, Dec. 2001, pp. 1931-1936.
Yoshioka et al., "A 10b 50MS/s 820 µW SAR ADC with On-Chip Digital Calibration," in IEEE Intern. Solid-State Circuits Conference, Feb. 2010, pp. 384-385.

* cited by examiner

US 9,143,144 B2

SYSTEMS AND METHODS FOR PROVIDING A PIPELINED ANALOG-TO-DIGITAL CONVERTER

CROSS REFERENCE TO RELATED APPLICATION

This application claims the benefit of U.S. Provisional Patent Application No. 61/454,217, filed Mar. 18, 2011, which is hereby incorporated by reference herein in its entirety.

STATEMENT REGARDING GOVERNMENT FUNDED RESEARCH

This invention was made with government support under grant PHY 0612811 awarded by the National Science Foundation. The government has certain rights in the invention.

BACKGROUND

Power hungry buffers and/or large decoupling capacitors have long been the solution to providing accurate reference voltages in pipelined Analog-to-Digital Converters (ADCs). Zero-crossing based pipelined ADCs offer a low power alternative to traditional op-amp based solutions, but their reference buffer design is exacerbated since the reference voltage has only a fraction of the hold phase (known as the pre-charge phase) to settle to the desired accuracy.

Accordingly, new systems and methods for providing a pipelined Analog-to-Digital Convener (ADC) are desirable.

SUMMARY

Systems and methods for providing a pipelined Analog-to-Digital Convener (ADC) are Provided. In some embodiments, systems for providing a pipelined Analog-to-Digital Converter are provided, the systems comprising: a first multiplying Digital-to-Analog Converter (MDAC) stage comprising: a sub-Analog-to-Digital Converter (ADC) that outputs a value based on an input signal; at least two reference capacitors that are charged to a reference voltage; at least two sampling capacitors that are charged to a sampling voltage; and a plurality of switches that couple the at least two reference capacitors so that they are charged during a sampling phase, that couple the at least two sampling capacitors so that they are charged during the sampling phase, that couple at least one of the reference capacitors so that it is parallel to one of the at least two sampling capacitors during a hold phase, and that couple the other of the at least two sampling capacitors so that it couples the at least one of the reference capacitors and the one of the at least two sampling capacitors to a reference capacitor of a second MDAC stage.

In some embodiments, methods for providing a pipelined Analog-to-Digital Converter are provided, the methods comprising: in a first multiplying Digital-to-Analog Converter (MDAC) stage: outputting from a sub-Analog-to-Digital Converter (ADC) a value based on an input signal; charging at least two reference capacitors to a reference voltage; charging at least two sampling capacitors to a sampling voltage; and using a plurality of switches to couple the at least two reference capacitors so that they are charged during a sampling phase, to couple the at least two sampling capacitors so that they are charged during the sampling phase, to couple at least one of the reference capacitors so that it is parallel to one of the at least two sampling capacitors during a hold phase, and to couple the other of the at least two sampling capacitors so that it couples the at least one of the reference capacitors and the one of the at least two sampling capacitors to a reference capacitor of a second MDAC stage.

DETAILED DESCRIPTION

Systems and methods for providing a pipelined Analog-to-Digital Converter (ADC) are provided. In accordance with some embodiments, a zero-crossing pipelined ADC that uses a reference pre-charge technique is provided.

Figure 1:
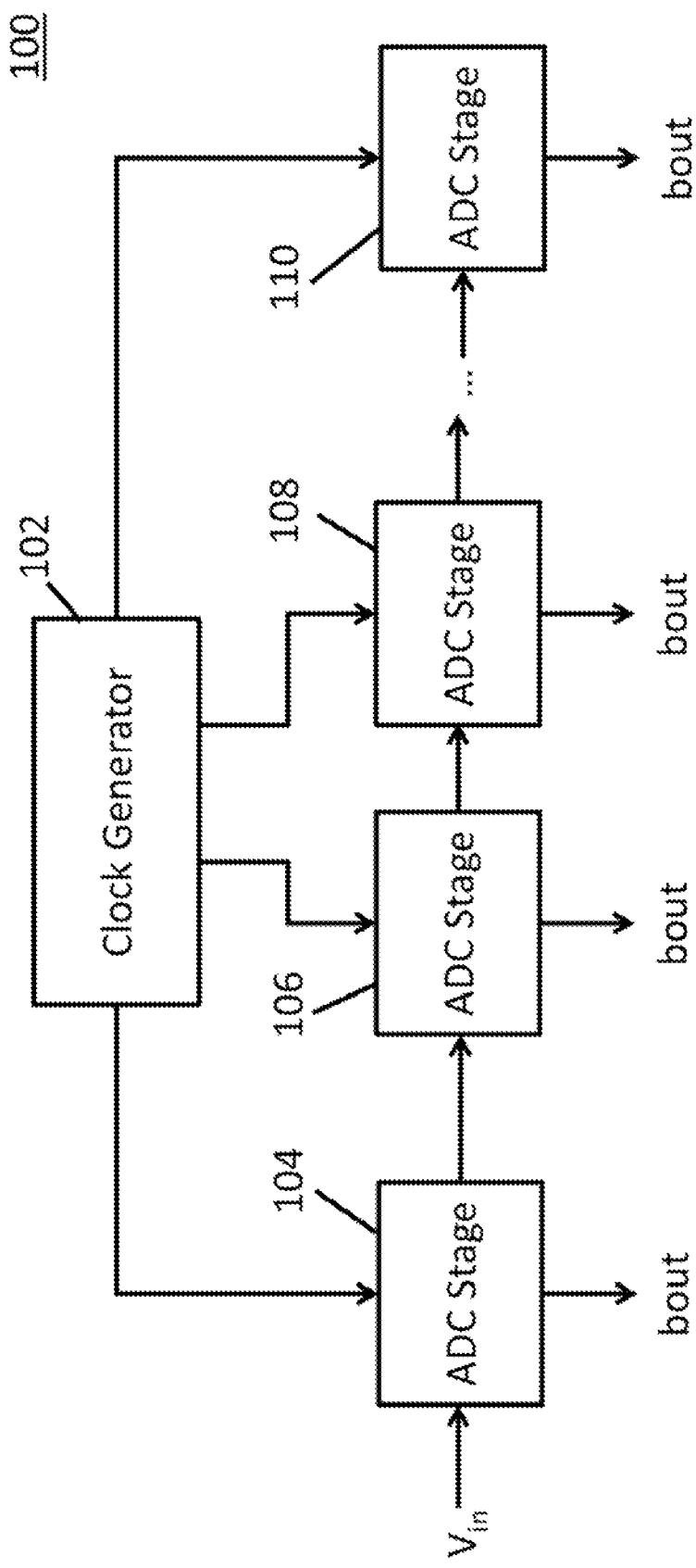
FIG. 1 is a block diagram of a pipelined Analog-to-Digital Converter (ADC) in accordance with some embodiments.

Turning to FIG. 1, an example of a general architecture 100 that can be used for a pipelined ADC in some embodiments is shown. As illustrated, architecture 100 can include a clock generator 102, non-final ADC stages 104, 106, and 108, and a final ADC stage 110. Although three non-final ADC stages are illustrated in FIG. 1, any suitable number of non-final ADC stages can be used in some embodiments.

Clock generator 102 can be any suitable circuit for generating clock signals for controlling the pipelined ADC in some embodiments. Examples of clock signals that can be generated by generator 102 are described below in accordance with some embodiments.

Non-final ADC stages 104, 106, and 108 can be any suitable non-final ADC stages, and may include a sub-ADC and a Multiplying Digital-to-Analog Converter (MDAC) such as the MDAC described below in accordance with some embodiments. Final ADC stages 110 can be any suitable final ADC stages, such as those described below in accordance with some embodiments.

Figure 2A:
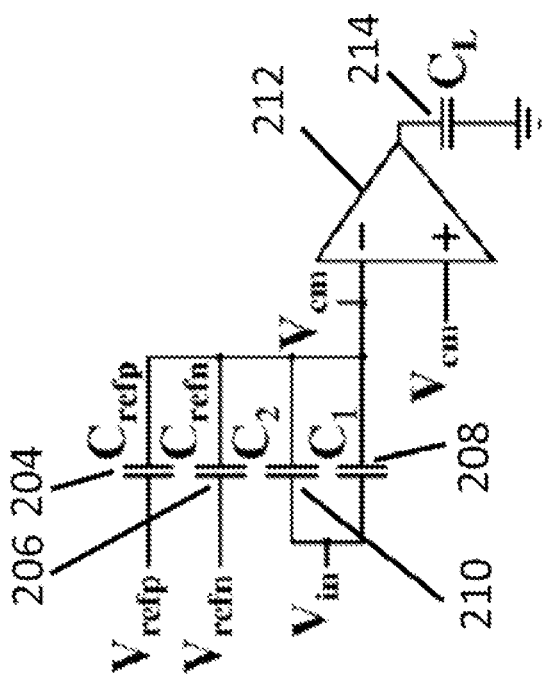
FIGS. 2a-2c are block diagrams of a Multiplying Digital-to-Analog Converter (MDAC) stage in accordance with some embodiments.
Figure 2B:
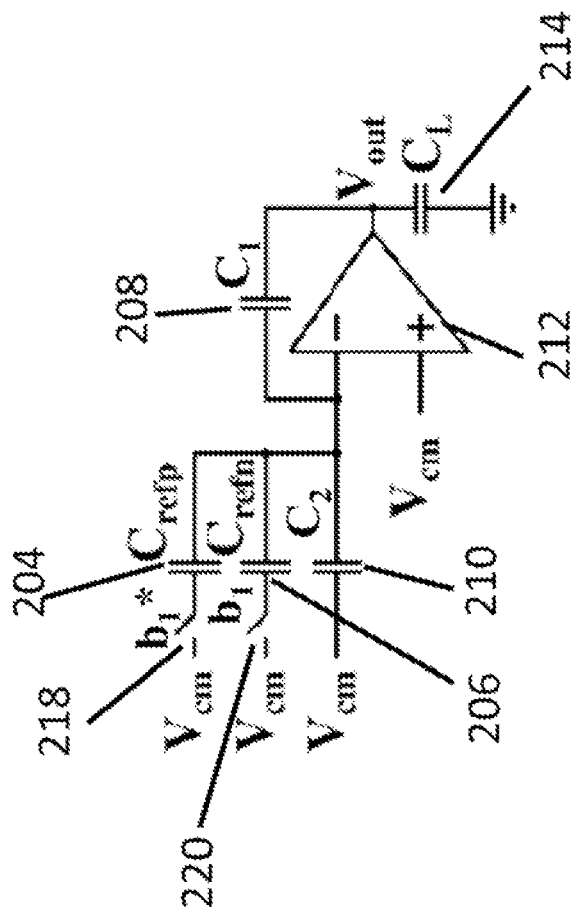
Figure 2C:
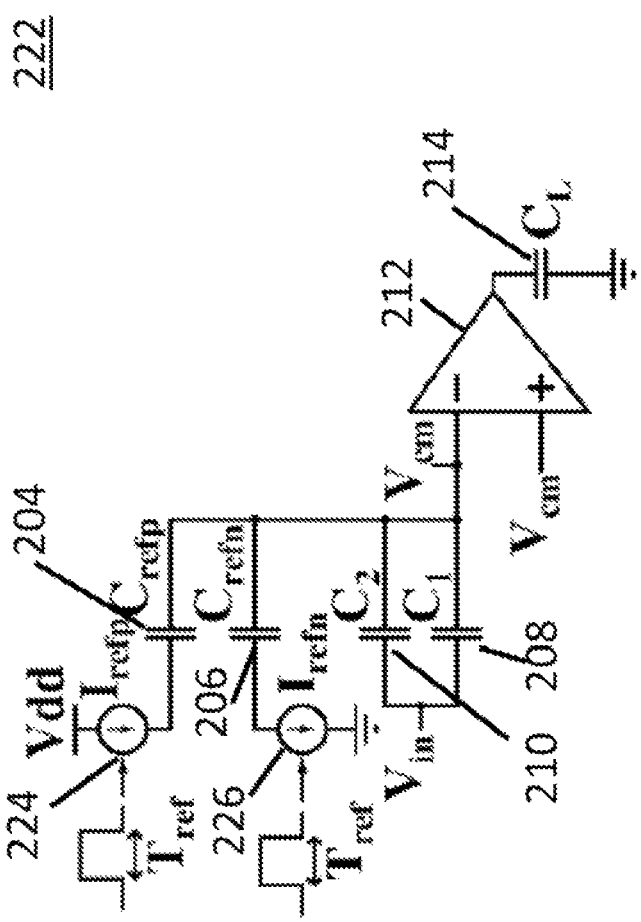

FIGS. 2a, 2b, and 2c illustrate example architectures 202, 216, and 222 of a 1-bit MDAC with a charge based reference that can be used in a non-final ADC stage in accordance with some embodiments. More particularly, FIG. 2a illustrates an example 1-bit MDAC architecture during a sample phase, FIG. 2b illustrates an example 1-bit MDAC architecture during a hold phase, and FIG. 2c illustrates an alternative 1-bit MDAC architecture to that in FIG. 2a during a sample phase.

As shown in FIG. 2a, architecture 202 can include reference capacitors $C_{refp}$ 204 and $C_{refn}$ 206, sampling capacitors $C_1$ 208 and $C_2$ 210, a comparator 212, and a load capacitance 214.

As shown, in the sample phase, the reference voltages $V_{refp}$ and $V_{refn}$ can be sampled onto the reference capacitors and input voltage $V_{in}$ can be sampled onto the sampling capacitors.

During a hold phase, as shown in FIG. 2b, one of two switches 218 and 220 can be closed based on whether a sub-ADC output bit associated with the stage is a zero or a one. That is, if the bit is a zero, then switch 218 will be closed, and if the bit is a one, then switch 220 will be closed. Charge stored on the corresponding capacitor 204 (which corresponds to switch 218) or capacitor 206 (which corresponds to switch 220) can be added to parallel sampling capacitor $C_2$ 210 and transferred along with charge from sampling capacitor $C_1$ 208 to load capacitance 214.

As shown FIG. 2c, in some embodiments, the charge that is supplied to the reference capacitors need not come from a voltage source. Instead, currents $I_{refp}$ and $I_{refn}$ from current sources 224 and 226 can be used to charge capacitors $C_{refp}$ and $C_{refn}$ for a period of time $T_{ref}$ and thereby provide the same amount of charge. The value of the reference voltage can be given by $V_{ref}=(I_{ref}/C_{ref})T_{ref}$. When using a current source to charge a reference capacitor, the exact value of the reference voltage sampled may not be known beforehand, as the parameters $I_{ref}$, $C_{ref}$ and $T_{ref}$ can be process dependent. But because this value is input signal independent, the error can be combined with stage gain error and corrected with Digital Gain Error Correction.

In some embodiments, each MDAC can use a 1 bit/stage architecture with a nominal gain of 1.75.

Figure 3:
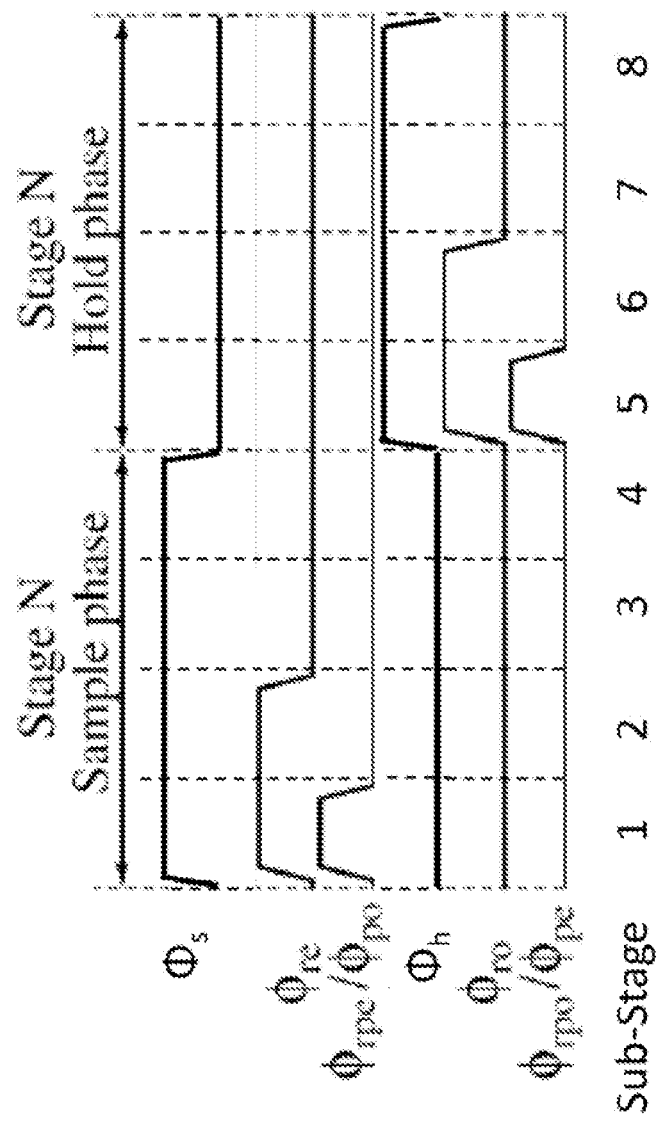
FIG. 3 is a timing diagram of clock signals in accordance with some embodiments.
Figure 4A:
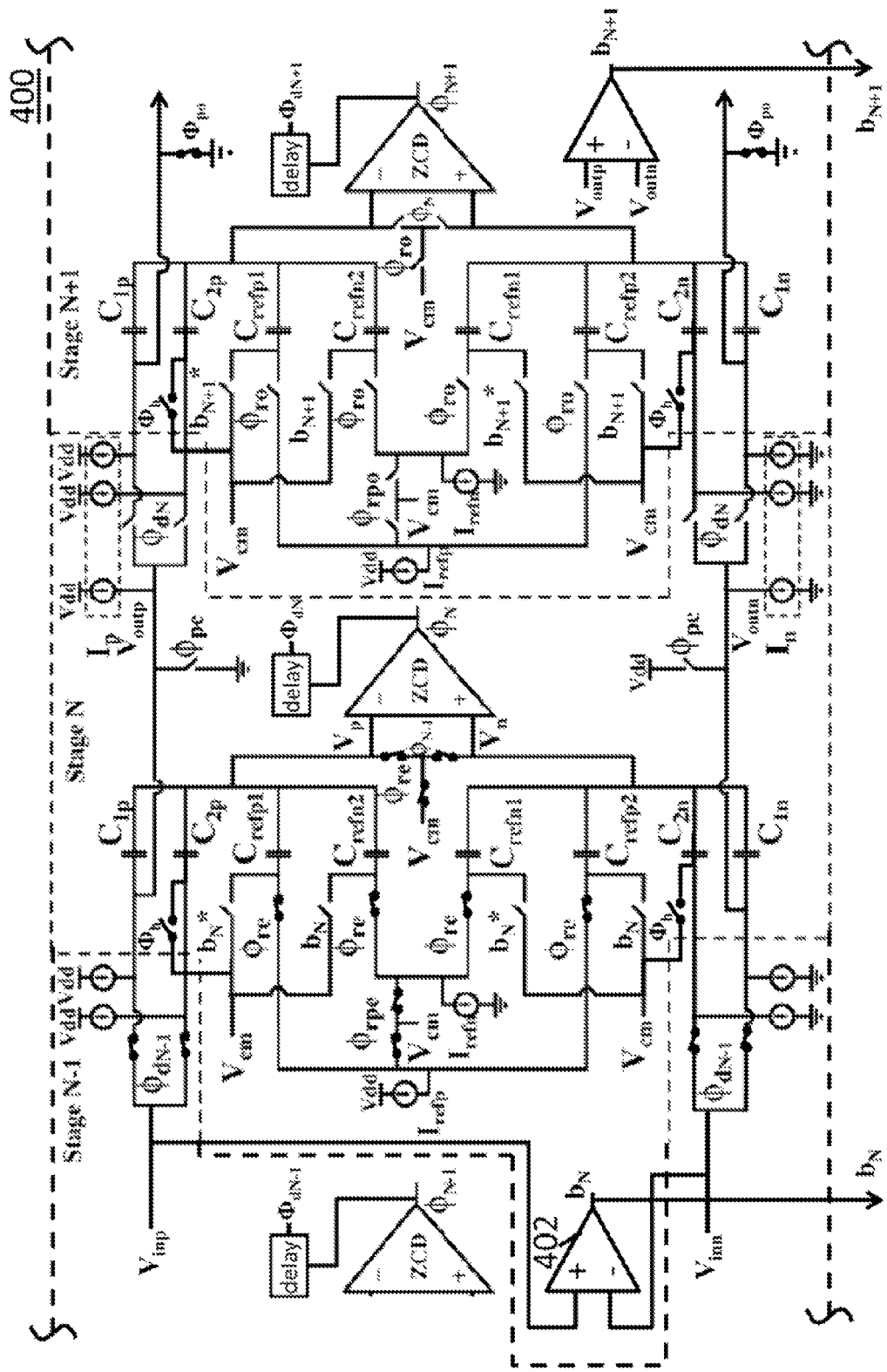
FIGS. 4a-4h are circuit diagrams showing a pipelined ADC stage in accordance with some embodiments.
Figure 4B:
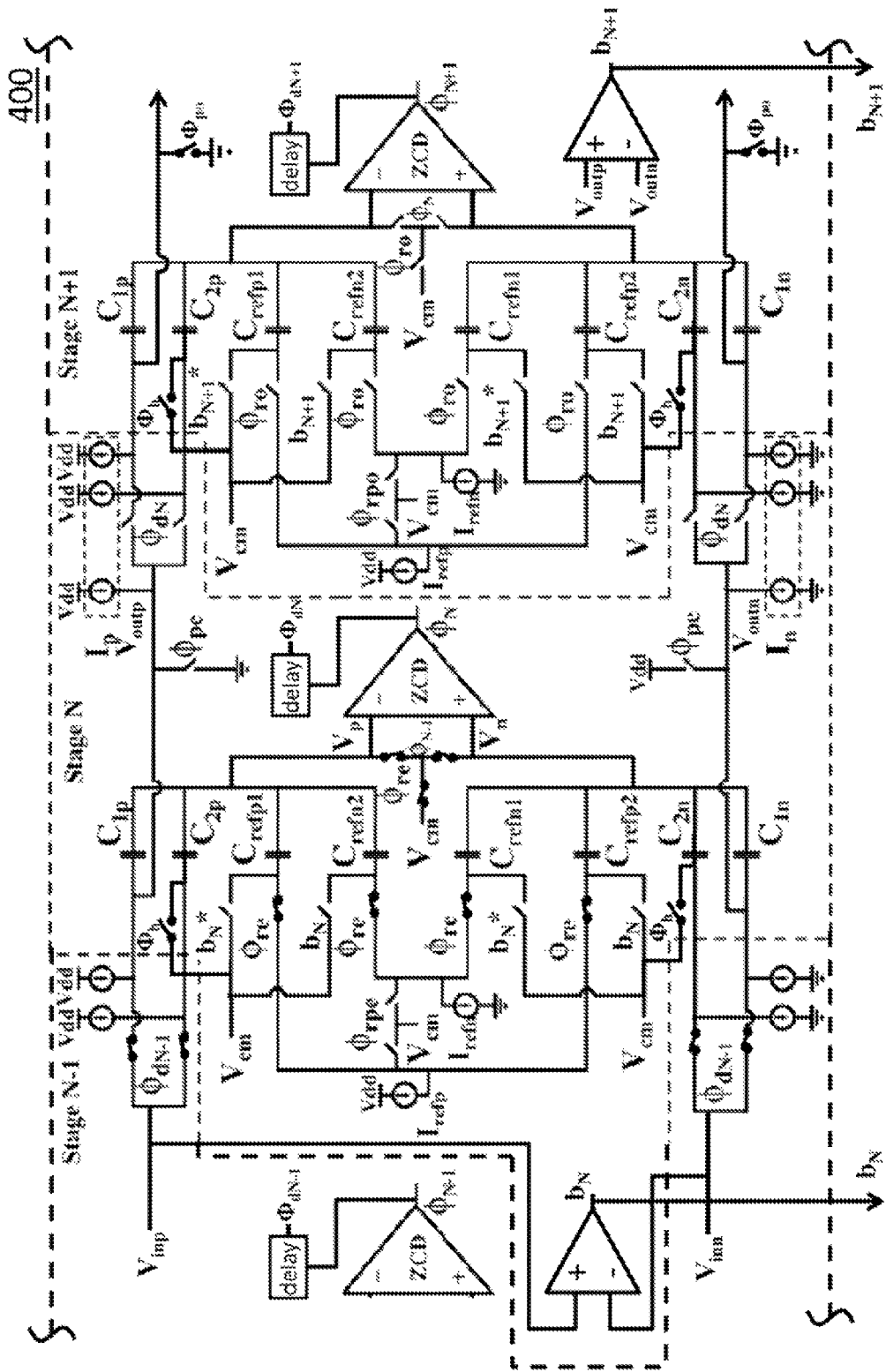
Figure 4C:
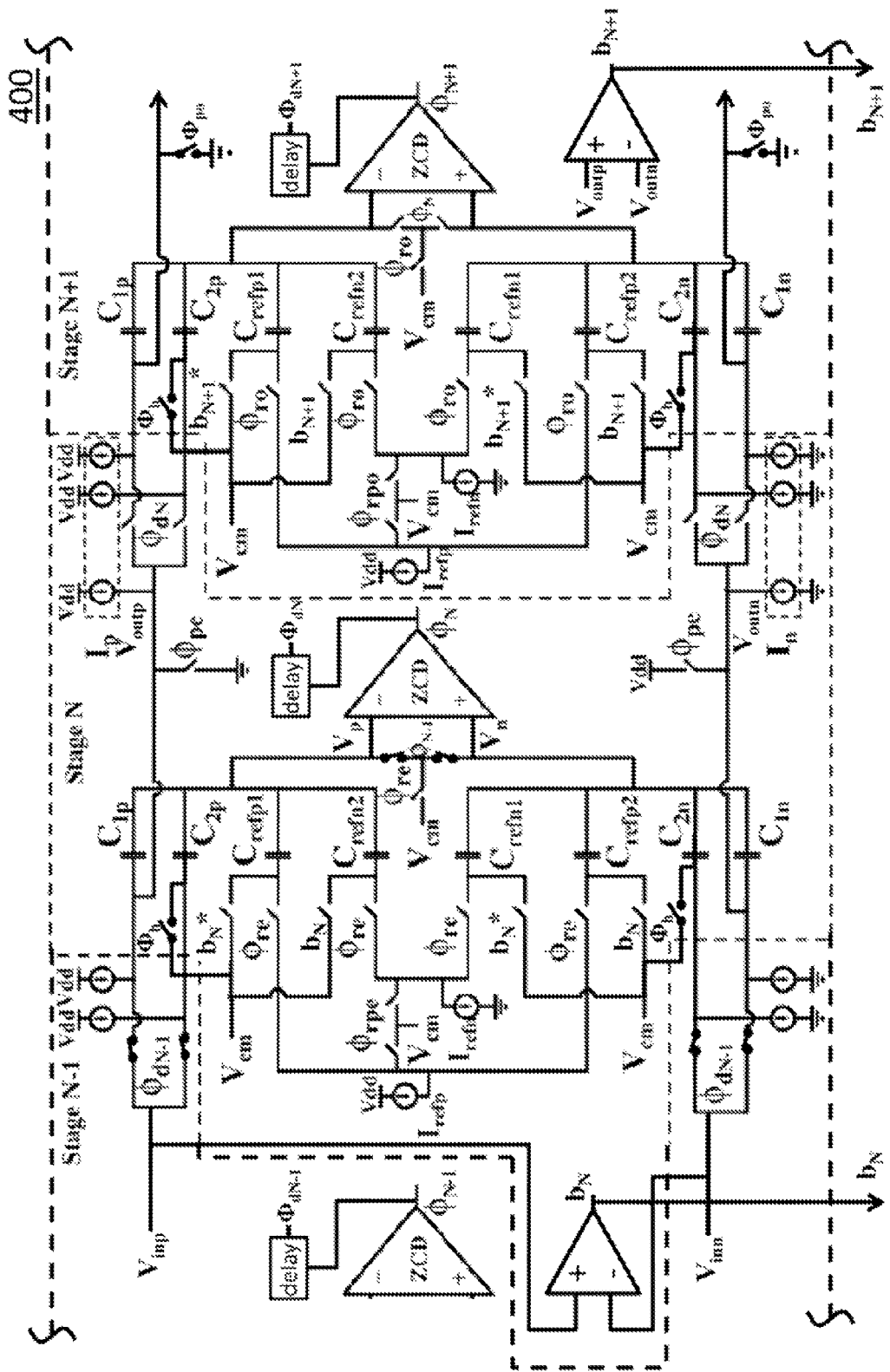
Figure 4D:
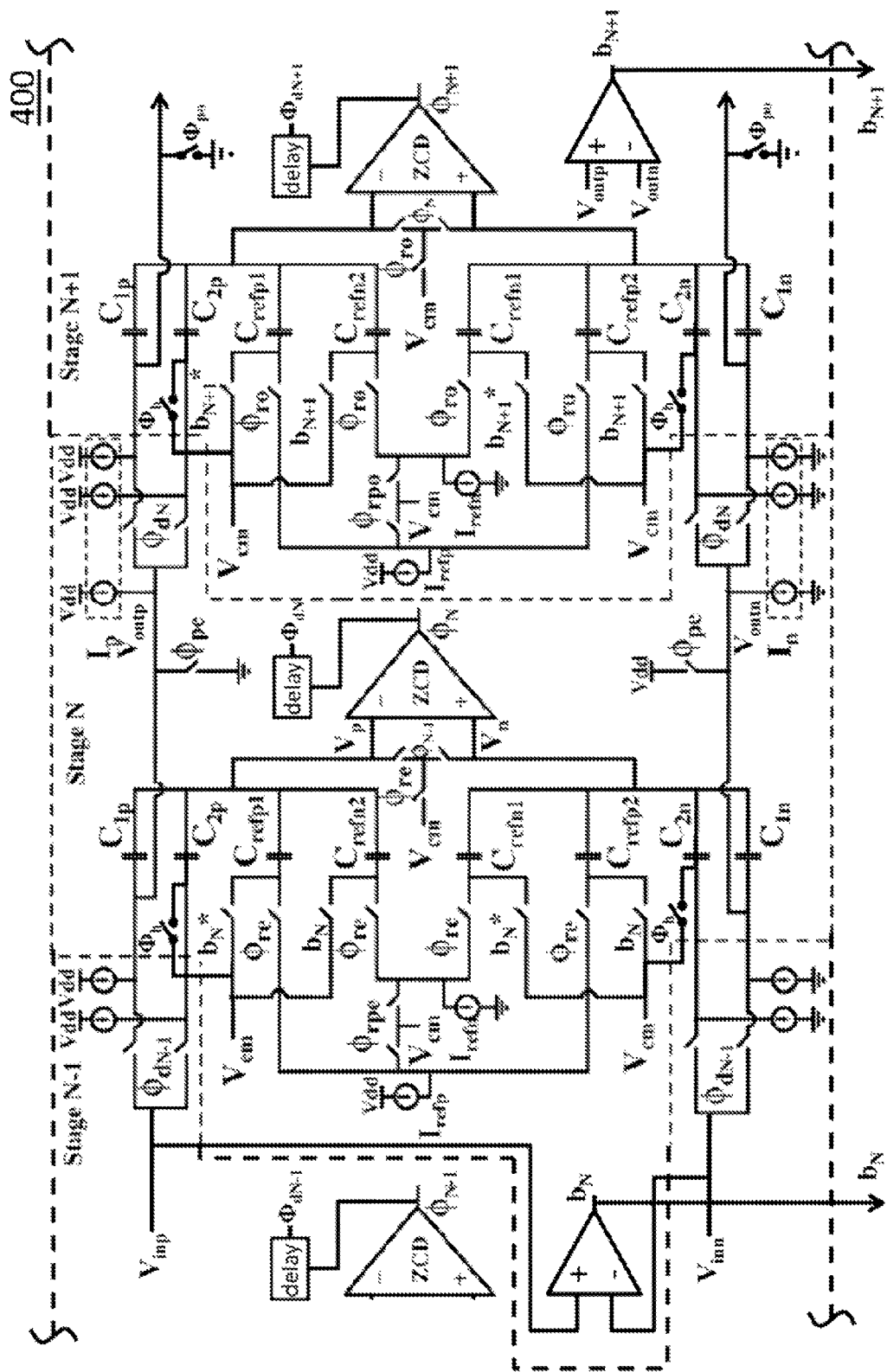
Figure 4E:
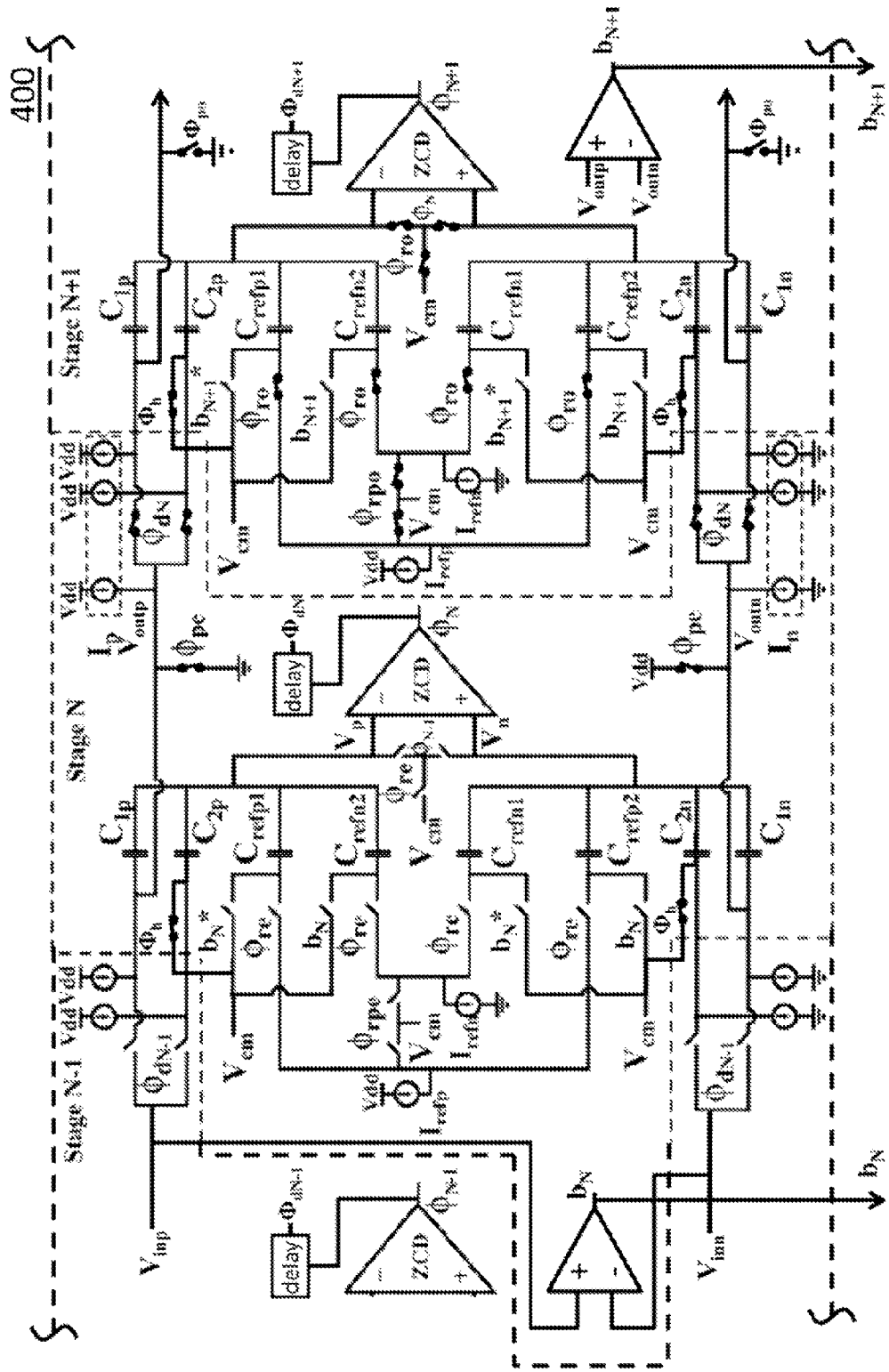
Figure 4F:
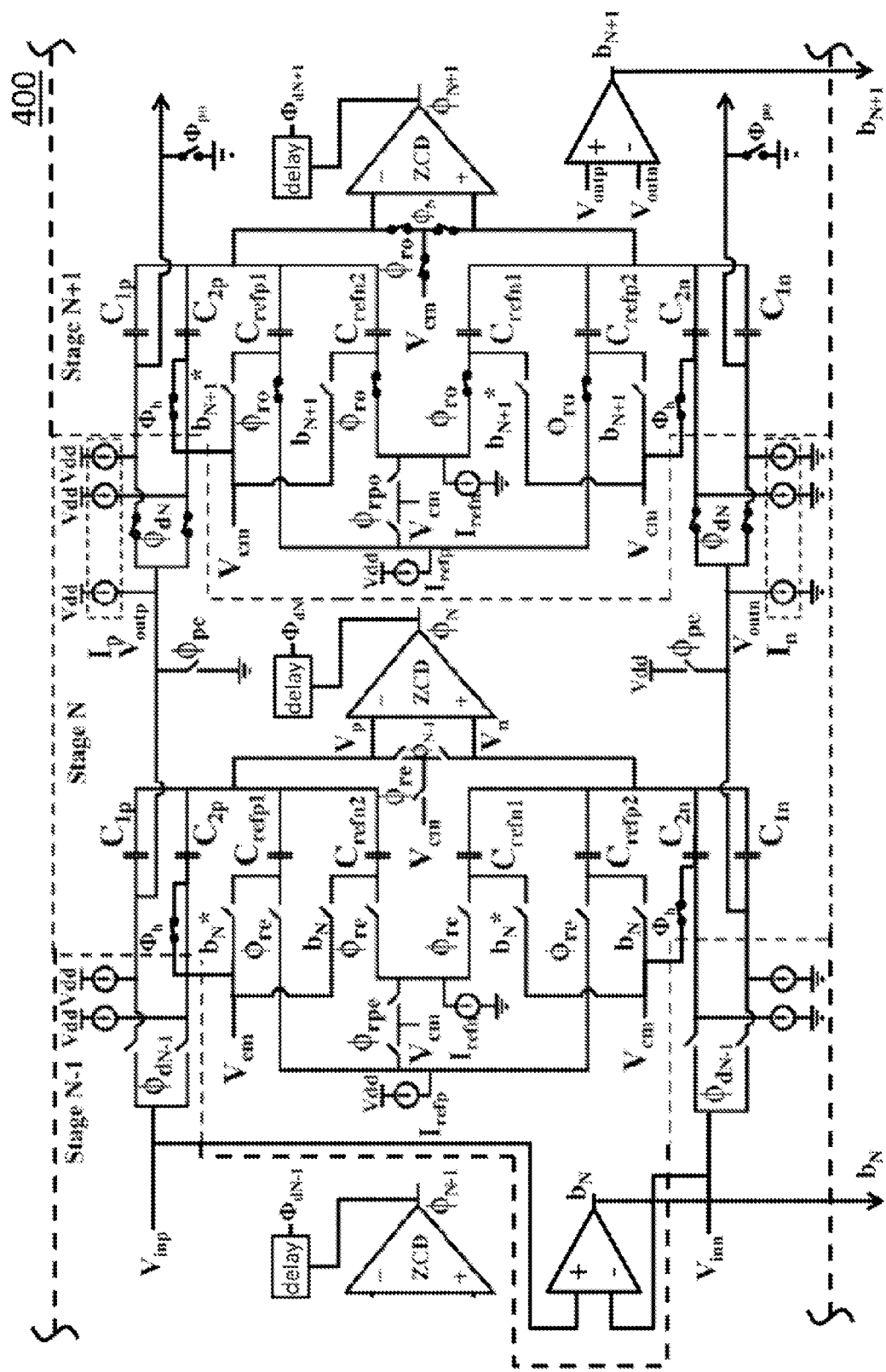
Figure 4G:
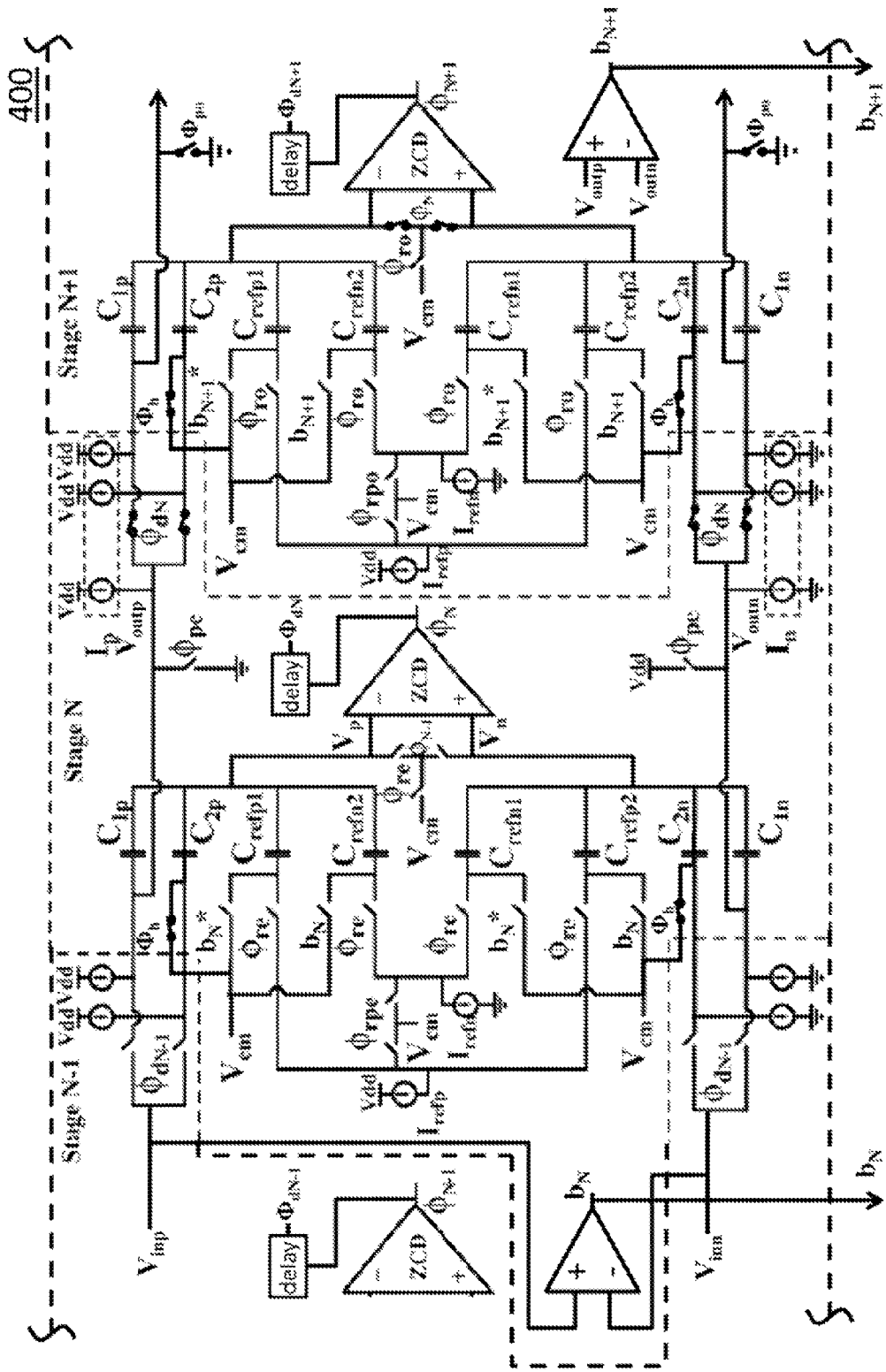
Figure 4H:
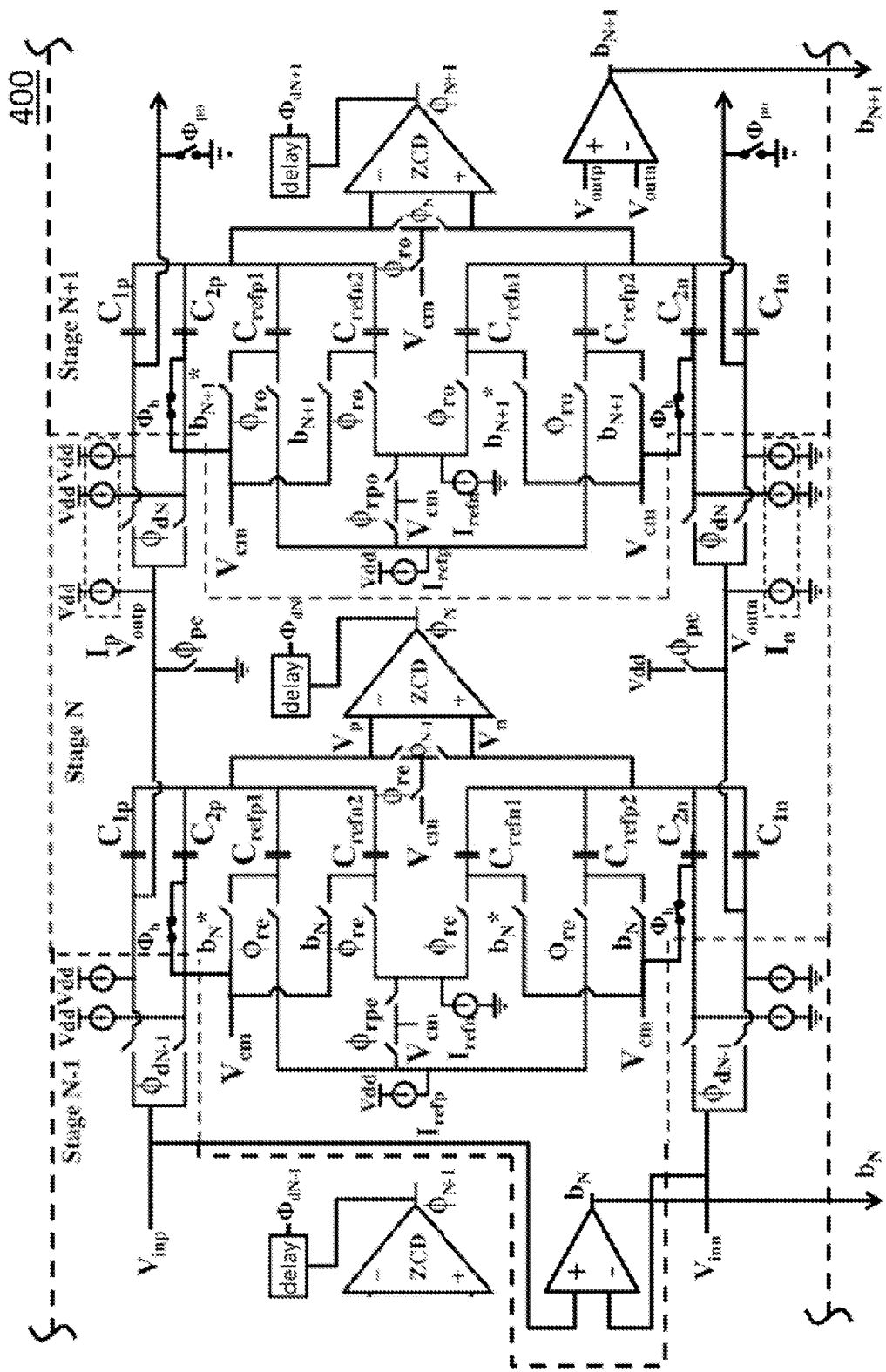

Turning to FIG. 3, a timing diagram of clock signals that can be generated by a clock generator for controlling the operation of a pipelined ADC in accordance with some embodiments is illustrated. As shown, each stage of the pipelined ADC has a sample phase and a hold phase represented by $\Phi_s$ and $\Phi_h$, respectively. During the sample phase, the stage input $V_{in}$ is sampled onto the sampling capacitors. During the hold phase, charge from the stage is transferred to the next stage.

During a pre-charge phase of the reference phase, represented by $\Phi_{rpe}$ for even numbered stages and $\Phi_{rpo}$ for odd numbered stages, the reference capacitors can be discharged.

During a reference charge phase, represented by $\Phi_{re}$ for even numbered stages and $\Phi_{ro}$ for odd numbered stages, reference current sources $I_{refp}$ and $I_{refn}$ can charge the reference capacitors $C_{refp1}$, $C_{refp2}$ and $C_{refn1}$, $C_{refn2}$ to a nominal reference voltage $V_{refp}$ and $V_{refn}$, respectively During a pre-charge phase for the sampling phase, represented by $\Phi_{po}$ for odd numbered stages and $\Phi_{pe}$ for even numbered stages, the sampling capacitors can be discharged.

FIGS. 4a-4h illustrate an example of a design for a pipelined ADC stage of a circuit 400 that uses a 1-bit MDAC architecture as described above, in FIGS. 2a-2C in accordance with some embodiments. As shown, the ADC stage is a differential stage and receives input voltages $V_{inp}$ and $V_{inn}$. Charge from these input voltages is stored in sampling capacitors $C_{1p}$, $C_{2p}$ and $C_{1n}$, $C_{2n}$, respectively. Input voltages $V_{inp}$ and $V_{inn}$ are also compared by comparator 402 (which acts as a 1-bit sub-ADC) to provide an output bit $b_N$. Reference capacitors $C_{refp1}$, $C_{refp2}$, $C_{refn1}$, and $C_{refn2}$ are charged by current sources $I_{refp}$ and $I_{refn}$. At the end of the sample phase, based on the value of $b_N$ output by comparator 402, the charge from one pair of reference capacitors $C_{refp1}$, $C_{refn1}$ or $C_{refp2}$, $C_{refn2}$ is transferred to the output capacitors $C_{1p}$, $C_{1n}$ during the hold phase, by shorting one of their plates to $V_{cm}$.

In circuit 400, the sampling of the input voltages, the charging of the reference capacitors, and the transfer of charge from these capacitors to the next stage is controlled by the illustrated switches that open or close based on the value of $\Phi_h$, $\Phi_{rpe}$, $\Phi_{rpo}$, $\Phi_{re}$, $\Phi_{ro}$, $\Phi_{pe}$, $\Phi_{po}$, $\Phi_{N-1}$, $\Phi_{dN-1}$, $\Phi_N$, $\Phi_{dN}$, $\Phi_{N+1}$, $\Phi_{dN+1}$, $b_N$, and $b_{N+1}$.

As described above, $\Phi_h$, $\Phi_{rpe}$, $\Phi_{rpo}$, $\Phi_{re}$, $\Phi_{ro}$, $\Phi_{pe}$, $\Phi_{po}$ can be generated by a clock generator in some embodiments. The eight FIGS. 4a-4h show the states of switches for $\Phi_h$, $\Phi_{rpe}$, $\Phi_{rpo}$, $\Phi_{re}$, $\Phi_{ro}$, $\Phi_{pe}$, $\Phi_{po}$ at the eight sub-stage periods 1-8, respectively, shown in FIG. 3, in some embodiments.

$\Phi_{N-1}$, $\Phi_{dN-1}$, $\Phi_N$, $\Phi_{dN}$, $\Phi_{N+1}$, $\Phi_{dN+1}$ can be generated by the ZCDs and delay circuits shown in some embodiments. $b_N$ and $b_{N+1}$ can be generated by the comparators shown in sonic embodiments. Although specific states for the switches for $\Phi_{N-1}$, $\Phi_{dN-1}$, $\Phi_N$, $\Phi_{dN}$, $\Phi_{N+1}$, $\Phi_{dN+1}$, $b_N$, and $b_{N+1}$ are shown, these switches can be opened or closed in some of the sub-stage periods based on the operation of the circuit and the stage input voltage in some embodiments. $b_N$ and $b_{N+1}$ can correspond to switches that close when these signals are high and $b_N^*$ and $b_{N+1}^*$ can correspond to switches that close when the signals $b_N$ and $b_{N+1}$ are low.

Any suitable zero-crossing detector (ZCD) can be used in circuit 400 in some embodiments. For example, a ZCD similar to the ZCD described in L. Brooks et al., "A 12b 50 MS/s, Fully Differential Zero-Crossing Based Pipelined ADC," IEEE Journal of Solid-State Circuits, December 2009, which is hereby incorporated by reference herein in its entirety, can be used in some embodiments. In some embodiments, this ZCD can use static inverters at its output to generate the necessary logic levels. Overshoot can be corrected by adjusting the relative strengths of the PMOS load pair of the ZCD in some embodiments.

Although not shown, additional calibration logic for gain calibration can be implemented in some embodiments.

In some embodiments, the output current sources $I_p$, $I_n$ that perform the charge transfer can employ local negative feedback to provide a constant ramp rate for good linearity.

In some embodiments, the bias currents for a first set of stages (e.g., stages 1-3) can be analog and digitally programmable, while those of the rest of the stages can share a common digital control.

In some embodiments, pipelined ADC 100 of FIG. 1 can be implemented so as to provide a multi-bit output at each ADC stage. Multi-bit non-final ADC stages 104, 106, and 108 in such a pipelined ADC can be any suitable multi-bit ADC stages, and can include a sub-ADC path and a multi-bit MDAC stage in some embodiments.

In some embodiments, the sub-ADC path can include a set of signal and reference capacitors and a sequential search a successive approximation register (SAR) ADC that can obtain its thresholds by capacitive division between its input and its reference, and hence may not require a reference buffer.

Figure 5:
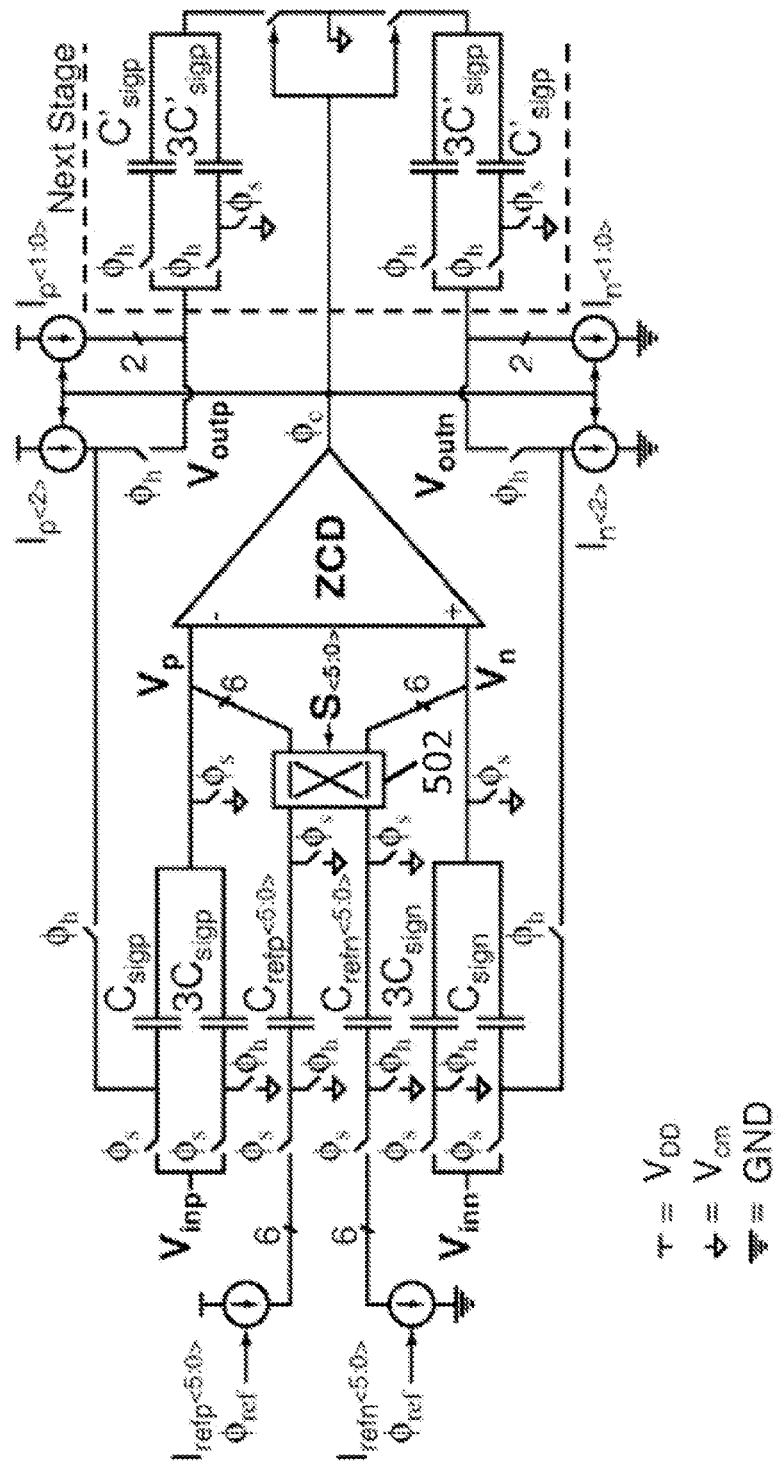
FIG. 5 is a circuit diagram of another pipelined ADC stage in accordance with some embodiments.

In some embodiments, the multi-bit MDAC stages can be implemented using a 2.5 bit zero-crossing MDAC stage, each with a gain of four, such as stage 500 of FIG. 5 in some embodiments.

Similarly to the circuits described above, in stage 500, during the sample phase $\Phi_s$, the differential input $V_{inp}$, $V_{inn}$ is sampled on the signal (or sampling) capacitors $C_{sigp}$, $C_{sign}$. Concurrently, during the reference pre-charge phase $\Phi_{ref}$, six reference current sources, $I_{refp}<5:0>$ and $I_{refn}<5:0>$, pre-charge six reference capacitors, $C_{refp}<5:0>$ and $C_{refn}<5:0>$, to the nominal reference voltages. At the end of the pre-charge phase $\Phi_p$, based on outputs $S<5:0>$ of a sub-ADC corresponding to the stage (not shown), the reference capacitors are connected appropriately to $V_p$ and $V_n$ by a switch 502. By the end of the hold phase $\Phi_h$, the charge is transferred to the next stage capacitors $C'_{sigp}$, $C'_{sign}$. The value of the reference voltage in the case of reference pre-charging is given by $V_{ref}=(I_{refp}/C_{refp}-I_{refn}/C_{refn})T_{ref}$, where $T_{ref}$ is the duration for which the reference current sources $I_{refp}<5:0>$ and $<5:0>$ charge the reference capacitors, $C_{refp}<5:0>$ and $C_{refn}<5:0>$. The exact value of $V_{ref}$ may not be known beforehand in some embodiments, but, because $V_{ref}$ is input-signal independent, the variation can be combined with stage gain error and corrected with digital gain error correction.

The loading can be reduced in some embodiments by connecting the reference capacitors to $V_p$ and $V_n$ only when required.

In some embodiments, each $C_{ref}$<5:0> can be chosen to be half the size of $C_{sig}$ as a tradeoff between the extra loading and power supply noise rejection. In some embodiments, the reference current sources $I_{refp}$<5:0> and $I_{refn}$<5:0> can be implemented as digitally programmable cascoded current sources. Switches (not shown) can be used to short the reference capacitors to the common-mode voltage $V_{cm}$ during $\Phi_{pr}$, and pre-charge the outputs $V_{outp}$ and $V_{outn}$ to GND and $V_{DD}$ respectively, during $\Phi_p$, in a similar manner to that shown in FIGS. 4a-4h in some embodiments.

The output current sources, $I_p$ and $I_n$, perform the actual charge transfer and can be implemented as regulated cascodes for good linearity performance in some embodiments. The zero-crossing detector (ZCD) can include a two-stage differential-to-single-ended amplifier for improved common-mode rejection. The overshoot at the output of the MDAC due to the finite delay of the ZCD can be compensated for by introducing an offset through a digitally programmable capacitor array connected to $V_p$ and $V_n$ as described in J. Chu et al., "A zero-crossing based 12b 100 MS/s pipelines ADC with decision boundary gap estimation calibration," VLSI Circuits (VLSIC), 2010 IEEE Symposium on, June 2010, which is hereby incorporated by reference herein in its entirety.

Figure 6:
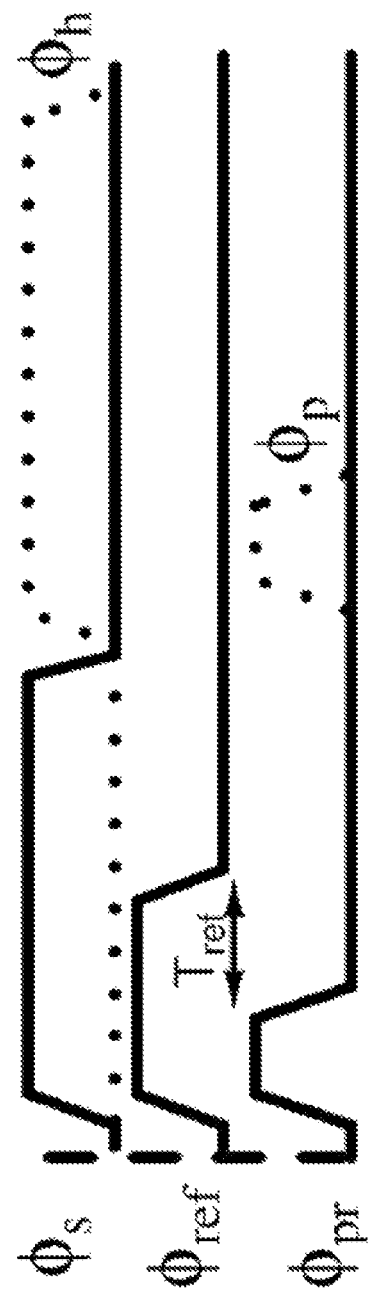
FIG. 6 is another timing diagram of clock signals in accordance with some embodiments.

A timing diagram for clock signals that can be used control stage 500 of FIG. 5 in accordance with some embodiments is shown in FIG. 6. The illustrated clock signals can be generated by any suitable clock generator in some embodiments.

Figure 7:
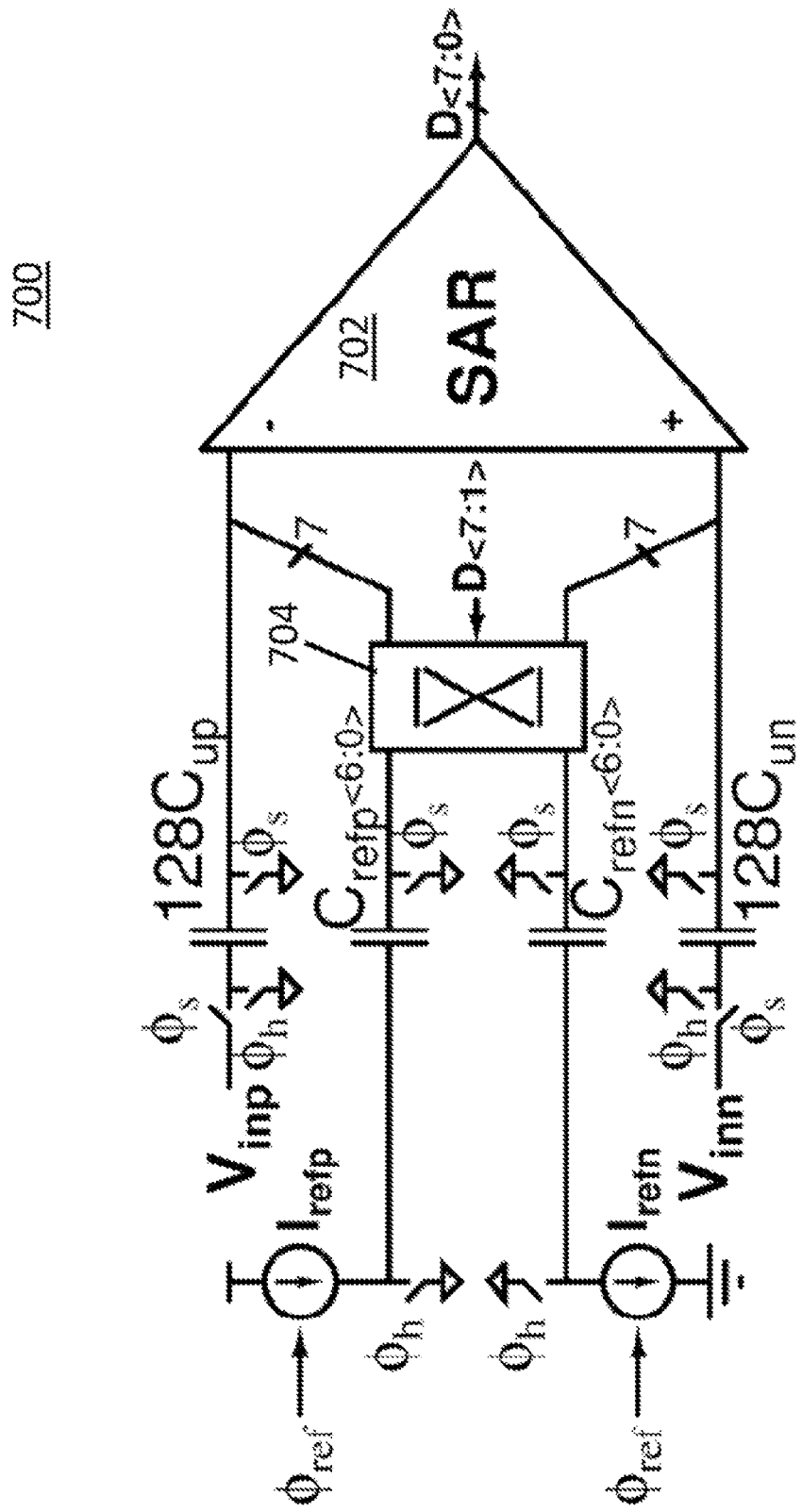
FIG. 7 is a circuit diagram of a final ADC stage in accordance with some embodiments.

An example of a circuit 700 that can be used to implement a final ADC stage 110 in accordance with some embodiments is shown in FIG. 7. As illustrated, reference pre-charging can be implemented in circuit 700 similarly to that shown and described above in connection with FIG. 5. Circuit 700 can also use a binary search SAR 702 to resolve the final eight bits of the pipelined ADC in some embodiments. Depending on the outputs D<7:1> of SAR 702, the reference capacitors are connected appropriately by switch 704 to implement a binary search in some embodiments. The SAR timing can be controlled using a delay locked loop in some embodiments.

In some embodiments, a pipelined ADC as described here can be implemented using only two external voltages: a $V_{DD}$ and a common-mode voltage $V_{cm}$, which can be nominally $V_{DD}/2$ formed using a resistive divider from $V_{DD}$.

Although the invention has been described and illustrated in the foregoing illustrative embodiments, it is understood that the present disclosure has been made only by way of example, and that numerous changes in the details of implementation of the invention can be made without departing from the spirit and scope of the invention, which is only limited by the claims which follow. Features of the disclosed embodiments can be combined and rearranged in various ways.

What is claimed:

1. A system for providing a pipelined Analog-to-Digital Converter, comprising:
    a first multiplying Digital-to-Analog Converter (MDAC) stage comprising:
        a sub-Analog-to-Digital Converter (ADC) that outputs a value based on an input signal;
        at least two reference capacitors that are charged to a reference voltage;
        at least two sampling capacitors that are charged to a sampling voltage; and
        a plurality of switches that couple the at least two reference capacitors so that they are charged during a sampling phase, that couple the at least two sampling capacitors so that they are charged during the sampling phase, that couple at least one of the reference capacitors so that it is parallel to one of the at least two sampling capacitors during a hold phase, and that couple the other of the at least two sampling capacitors so that it couples the at least one of the reference capacitors and the one of the at least two sampling capacitors to a reference capacitor of a second MDAC stage.

2. The system of claim 1, wherein the first MDAC stage further comprises a first current source coupled to a first of the at least two reference capacitors and a second current source coupled to a second of the at least two reference capacitors.

3. The system of claim 2, wherein the first current source and the second current source are cascoded current sources.

4. The system of claim 2, wherein the first current source charges the first of the at least two reference capacitors for a given period of time and the second current source charges the second of the at least two reference capacitors for the given period of time.

5. The system of claim 1, wherein the first MDAC stage further comprises a zero-crossing detector that controls how long the at least two sampling capacitors are coupled to an input voltage.

6. The system of claim 5, wherein the first MDAC stage further comprises a delay circuit that receives an output signal of the zero-crossing detector and provides a delayed signal that controls when the at least two sampling capacitors are coupled to the input voltage.

7. The system of claim 1, wherein the sub-ADC is as comparator.

8. The system of claim 1, wherein the sub-ADC is a flash ADC.

9. The system of claim 1, wherein the first MDAC stage is a differential MDAC stage.

10. The system of claim 1, wherein the at least two reference capacitors are half the size of the at least two sampling capacitors.

11. A method for providing a pipelined Analog-to-Digital Converter, comprising:
    in a first multiplying Digital-to-Analog Converter (MDAC) stage:
    outputting from a sub-Analog-to-Digital Converter (ADC) a value based on an input signal;
    charging at least two reference capacitors to a reference voltage;
    charging at least two sampling capacitors to a sampling voltage; and
    using a plurality of switches to couple the at least two reference capacitors so that they are charged during a sampling phase, to couple the at least two sampling capacitors so that they are charged during the sampling phase, to couple at least one of the reference capacitors so that it is parallel to one of the at least two sampling capacitors during a hold phase, and to couple the other of the at least two sampling capacitors so that it couples the at least one of the reference capacitors and the one of the at least two sampling capacitors to a reference capacitor of a second MDAC stage.

12. The method of claim 11, charging a first of the at least two reference capacitors using a first current source and charging a second of the at least two reference capacitors using a second current source.

13. The method of claim 12, wherein the first current source and the second current source are cascoded current sources.

14. The method of claim 12, wherein the first current source charges the first of the at least two reference capacitors for a given period of time and the second current source charges the second of the at least two reference capacitors for the given period of time.

15. The method of claim 11, wherein controlling how long the at least two sampling capacitors are coupled to an input voltage using a zero-crossing detector.

16. The method of claim 15, further comprising providing a delayed signal that controls when the at least two sampling capacitors are coupled to the input voltage in response to an output of the zero-crossing detector.

17. The method of claim 11, wherein the sub-ADC is a comparator.

18. The method of claim 11, wherein the sub-ADC is a flash ADC.

19. The method of claim 11, wherein the first MDAC stage is a differential MDAC stage.

20. The method of claim 11, wherein the at least two reference capacitors are half the size of the at least two sampling capacitors.

* * * * *